(12) United States Patent
Chien et al.

(10) Patent No.: US 7,209,349 B2
(45) Date of Patent: Apr. 24, 2007

(54) HEAT DISSIPATION DEVICE

(75) Inventors: Tsan-Nan Chien, Taipei (TW); Yu Liu, Tao Yuan (TW); Yu-Nien Huang, Chung Li (TW); Shun-Ta Yu, Taipei (TW); Cheng-Yu Wang, Hsinchu (TW); Jim-Fat Tseng, Kaohsiung (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 128 days.

(21) Appl. No.: 11/132,584

(22) Filed: May 19, 2005

(65) Prior Publication Data

US 2006/0092607 A1  May 4, 2006

(30) Foreign Application Priority Data

Oct. 28, 2004  (TW)  .............................. 93132690 A

(51) Int. Cl.
    *H05K 7/20* (2006.01)
(52) U.S. Cl. ...................... 361/687; 361/703; 361/704; 165/80.3; 257/718
(58) Field of Classification Search ................ 361/683, 361/680, 687, 695, 686, 688–689, 700–710, 361/722, 719, 721; 165/80.2, 80.3, 104.32–104.34, 165/185, 104.26–104.27, 122–126; 174/252, 174/16.3; 257/706–727; 312/223.2; 702/64, 702/65
See application file for complete search history.

(56) References Cited

U.S. PATENT DOCUMENTS

| | | | | |
|---|---|---|---|---|
| 5,689,654 A * | 11/1997 | Kikinis et al. | .............. | 710/303 |
| 5,898,568 A * | 4/1999 | Cheng | ......................... | 361/695 |
| 5,898,569 A * | 4/1999 | Bhatia | ........................ | 361/700 |
| 5,953,211 A * | 9/1999 | Donahoe et al. | ............ | 361/704 |
| 5,963,887 A * | 10/1999 | Giorgio | ...................... | 702/64 |
| 6,104,607 A * | 8/2000 | Behl | ......................... | 361/687 |
| 6,396,693 B1* | 5/2002 | Shih | ............................ | 361/703 |
| 6,906,922 B2* | 6/2005 | Yu et al. | ..................... | 361/697 |
| 6,909,602 B2* | 6/2005 | Dietrich et al. | ............. | 361/687 |
| 6,922,787 B2* | 7/2005 | Karpel et al. | ............... | 713/320 |
| 2004/0226695 A1* | 11/2004 | Bolle et al. | ............ | 165/104.21 |
| 2005/0248918 A1* | 11/2005 | Lin | ............................ | 361/687 |

* cited by examiner

*Primary Examiner*—Michael Datskovskiy
(74) *Attorney, Agent, or Firm*—Thomas, Kayden, Horstemeyer & Risley

(57) ABSTRACT

A heat dissipation device for dissipating heat form a heat source includes a control unit, a sensor, a first heat dissipation module, a second heat dissipation module, and a driving mechanism. The sensor electrical connects with the control unit and detects a temperature of the heat source, and reports the temperature to the control unit. The second heat dissipation module is retractably connected to the first heat dissipation module. The driving mechanism is electrically connected to the control unit and the second heat dissipation module. When the temperature exceeds a first temperature, the control unit informs the driving mechanism to extend away from the second heat dissipation module with respect to the first heat dissipation module.

9 Claims, 7 Drawing Sheets

HEAT DISSIPATION DEVICE

BACKGROUND

The invention relates to a heat dissipation device with retractable heat dissipation modules, and more particularly, to a heat dissipation device with automatically adjustable heat dissipation modules.

FIG. 1 shows a conventional heat dissipation device 1 employing a fan 11 to provide an airflow to heat dissipation module 12, dissipating heat from an electronic device disposed under the heat dissipation module 12. When the temperature of the electronic device is raised, the speed of the fan 11 is increased to enhance dissipation efficiency. This conventional structure, however, is inadequate for devices requiring greater cooling.

SUMMARY

Accordingly, the invention is to solve the mentioned problem, providing a heat dissipation device with increased convection area to enhance dissipation efficiency.

The heat dissipation device for dissipating heat from a heat source comprises a control unit, a sensor, a first heat dissipation module, a second heat dissipation module, and a driving mechanism. The sensor electrical connects with the control unit and detects a temperature of the heat source, and reports the temperature to the control unit. The second heat dissipation module is retractably connected to the first heat dissipation module. The driving mechanism is electrically connected to the control unit and the second heat dissipation module. When the temperature exceeds a first temperature, the control unit informs the driving mechanism to extend away from the second heat dissipation module with respect to the first heat dissipation module.

The heat dissipation device may comprise a fan electrically connected to the control unit. When the temperature exceeds a second temperature, the control unit informs the fan to increase rotational speed.

As mentioned, the first temperature may exceed the second temperature.

The heat dissipation device may comprise a housing connected to and protecting the second heat dissipation module.

Accordingly, the control unit may be a central processing unit (CPU) or a basic input output system (BIOS), and the driving mechanism may be a motor.

The heat dissipation device may comprise a heat conductive material disposed between the first heat dissipation module and the second heat dissipation module.

The first heat dissipation module may comprise a plurality of connected first heat dissipation units, and the second heat dissipation module may comprise a plurality of connected second heat dissipation units. Thus, the heat conductive material is disposed between every first and second heat dissipation unit.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
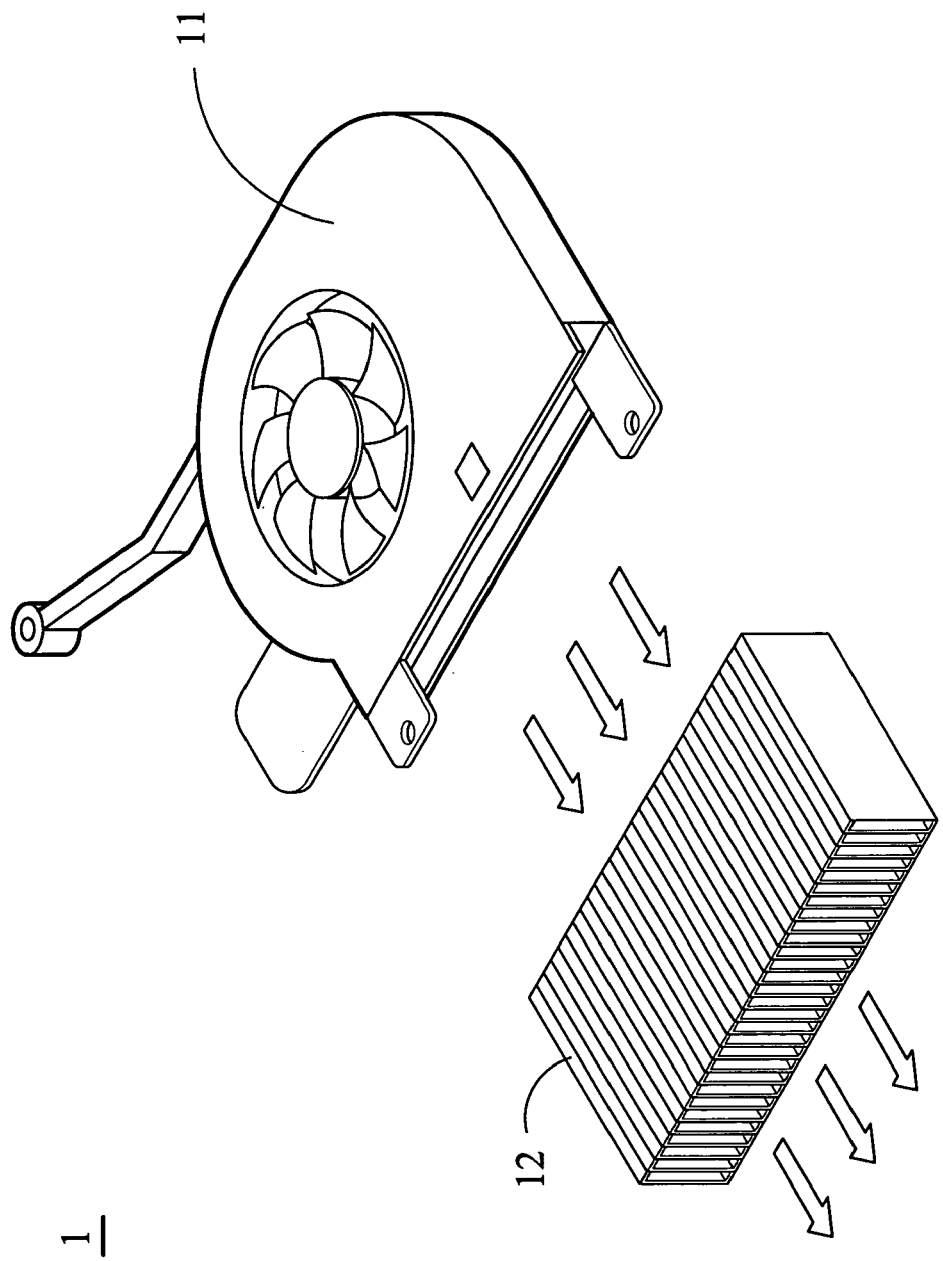
FIG. 1 is a schematic diagram of a conventional heat dissipation device.
Figure 2A:
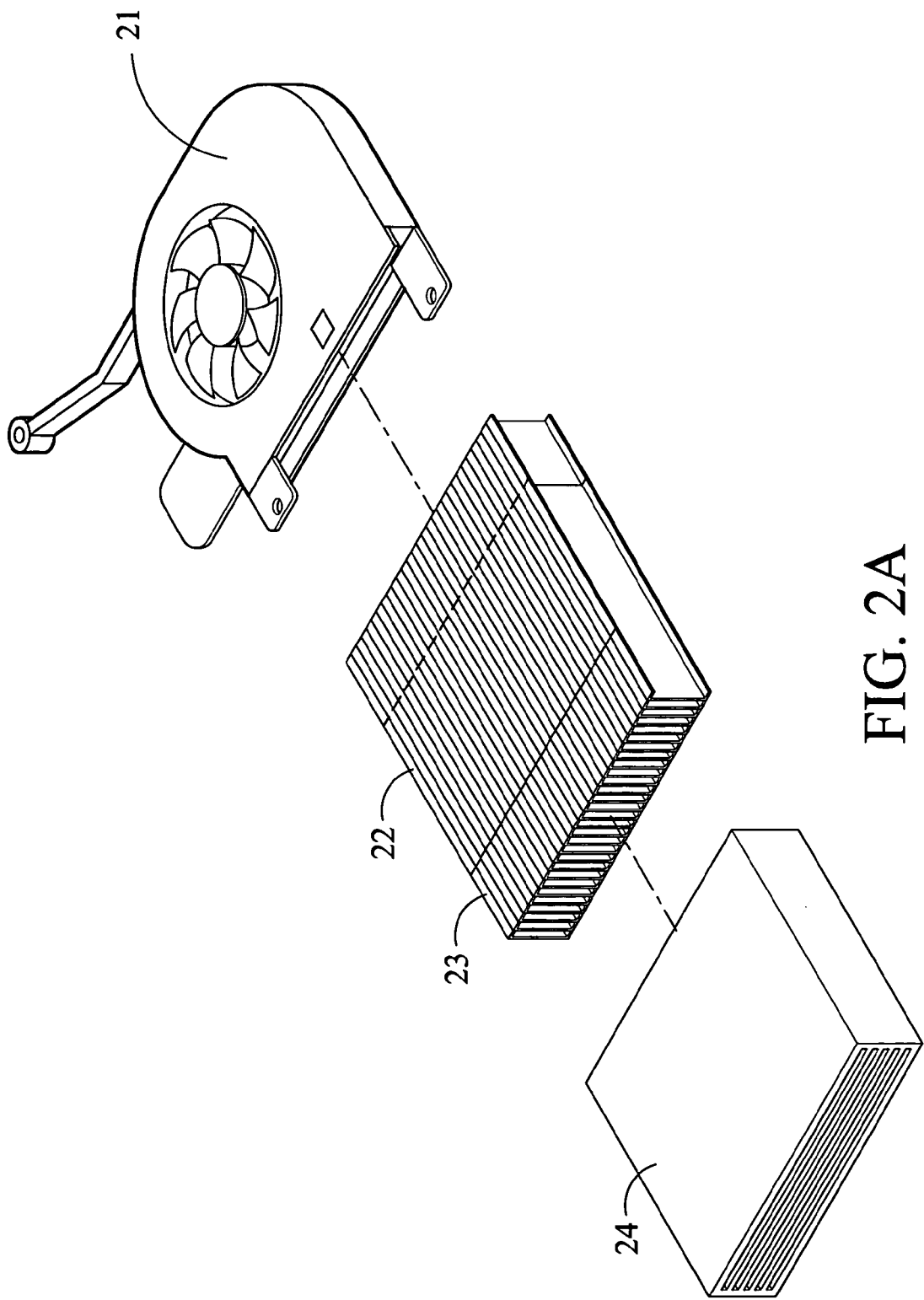
FIG. 2A is a schematic diagram of a heat dissipation device of the invention.
Figure 2B:
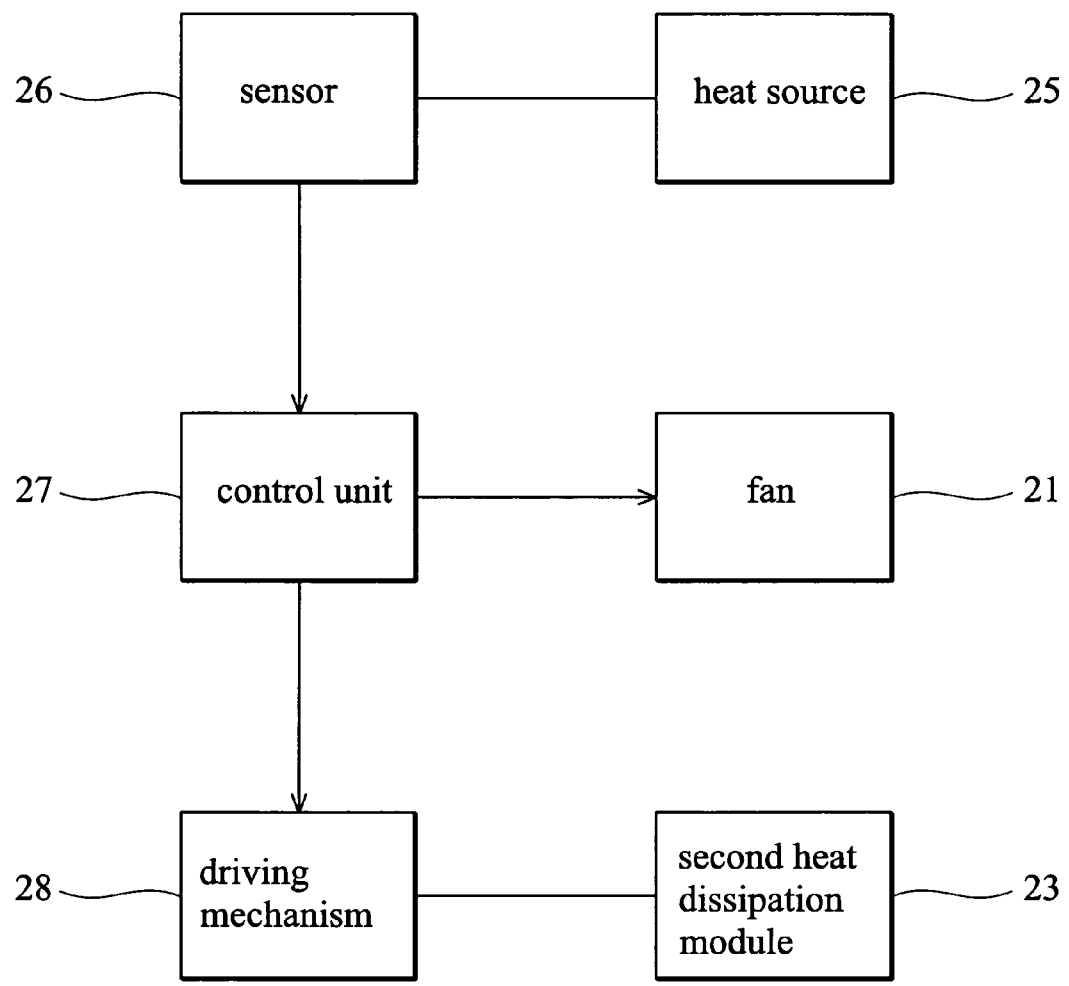
FIG. 2B is a block diagram of a heat dissipation device of the invention.

FIG. 2A depicts an exemplary embodiment of a heat dissipation device of the invention, and FIG. 2B shows a block diagram of the heat dissipation device. The heat dissipation device comprises a fan 21, a first heat dissipation module 22, a second heat dissipation module 23, a housing 24, a sensor 26, a control unit 27, and a driving mechanism 28. The sensor 26 is disposed near a heat source 25 to detect the temperature thereof, and reports the temperature to the control unit 27. The control unit 27 is electrically connected to the fan 21 and the driving mechanism 28. The second heat dissipation module 23 is retractably connected to the first heat dissipation module 22. The driving mechanism 28 drives the second heat dissipation module 23 to extend or retract with respect to the first heat dissipation module 22. The housing 24 is connected to the second heat dissipation module 23 and moves therewith.

When the sensor 26 detects the temperature of the heat source 25 exceeds a specific temperature, for example a second temperature, the control unit 27 informs the fan 21 to raise the rotational speed, increasing the heat dissipation efficiency. As the temperature is continuously increased, and the sensor 26 detects the temperature of the heat source 25 exceeds another specific temperature, for example a first temperature, the control unit 27 informs the driving mechanism 28 to extend away from the second heat dissipation module 23 with respect to the first heat dissipation module 22, thereby increasing the area of convection heat transfer, increasing the heat dissipation efficiency. Thereafter, the fan 21 blows the first heat dissipation module 22 and the second heat dissipation module 23, transferring the heat.

As mentioned above, the control unit 27 may be a central processing unit (CPU), a basic input output system (BIOS), or other similar mechanism. The driving mechanism 28 may be a motor or other similar mechanism, driving the first or the second heat dissipation module to extend or retract. The first temperature exceeds the second temperature.

A heat conductive material may further be disposed between the first heat dissipation module 22 and the second heat dissipation module 23, increasing thermal conductivity therebetween and facilitating smooth movement.

Figure 3A:
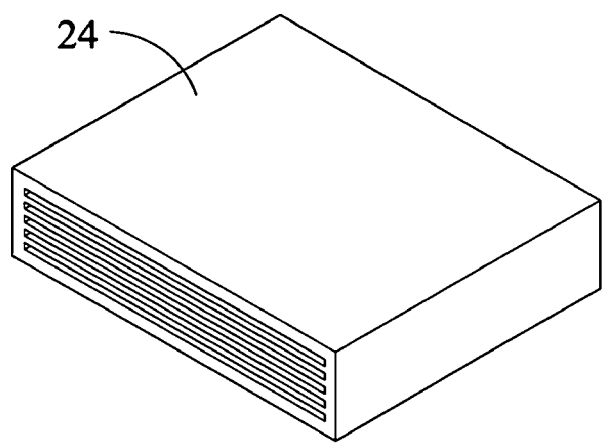
FIG. 3A is a schematic diagram of a heat dissipation device of the invention, with the heat dissipation module in a retracted position.
Figure 3B:
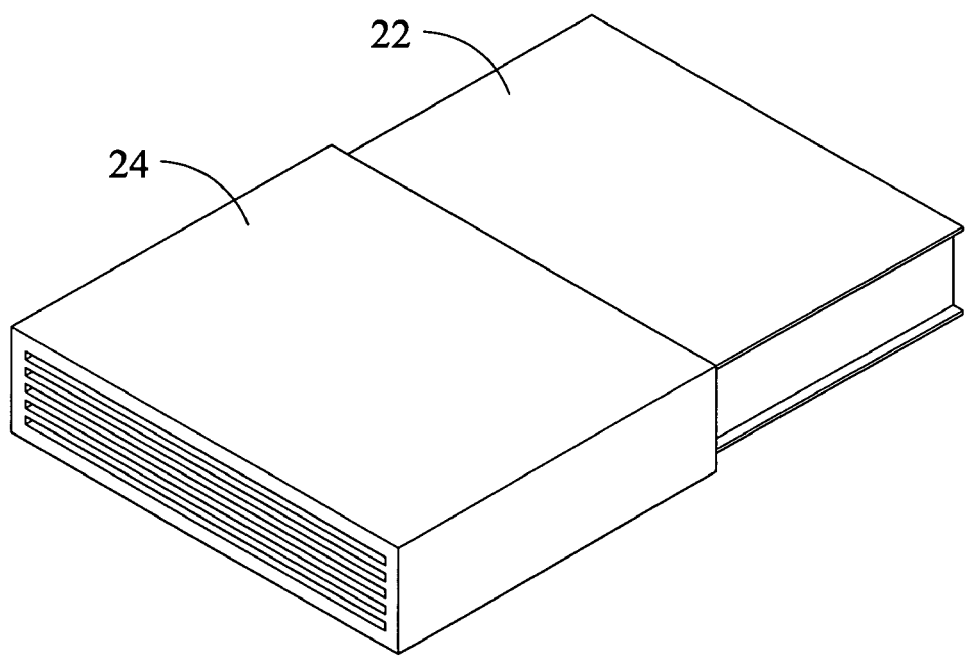
FIG. 3B is a schematic diagram of a heat dissipation device of the invention, with the heat dissipation module in an extended position.

FIG. 3A depicts a schematic diagram of the heat dissipation device of the invention, with the heat dissipation modules in a retracted position. FIG. 3B depicts a schematic diagram of the heat dissipation device of the invention, with the heat dissipation modules in an extended position. When the first and second heat dissipation modules 22 and 23 are in the retracted position, the second heat dissipation module 23 is received in the first heat dissipation module 22. At this retracted state, the first and second heat dissipation modules 22 and 23 are both received in the housing 24. When the first and second heat dissipation modules 22 and 23 are in the extended position, the second heat dissipation module 23 is extended away from the first heat dissipation module 22 by the driving mechanism 28. At this extended state, the first heat dissipation module 22 is exposed from the housing 24.

Figure 4A:
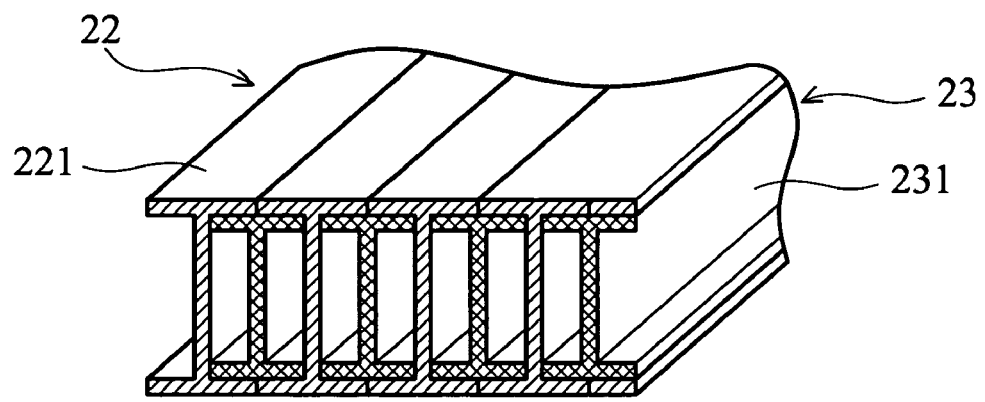
FIG. 4A is a partially enlarged view of heat dissipation modules of the invention.
Figure 4B:
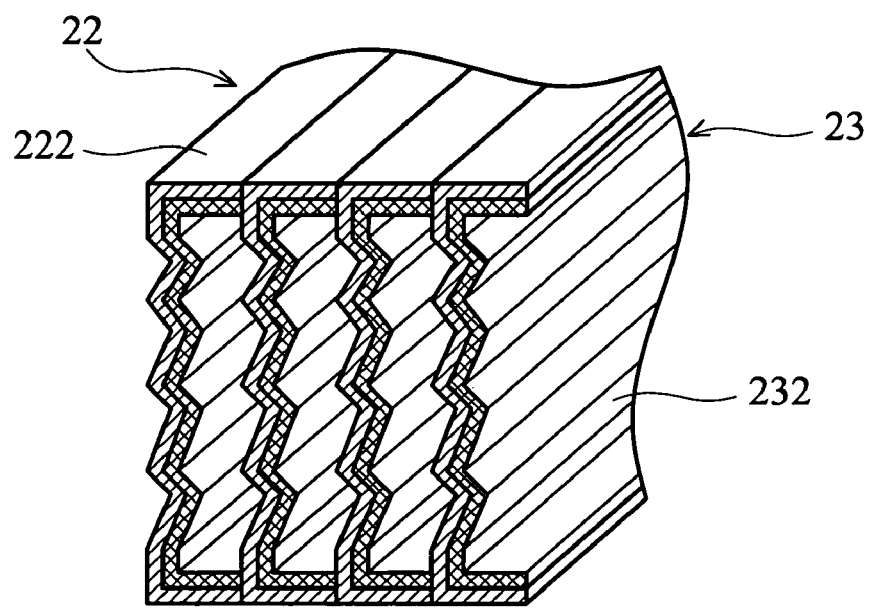
FIG. 4B is another partially enlarged view of heat dissipation modules of the invention.
Figure 4C:
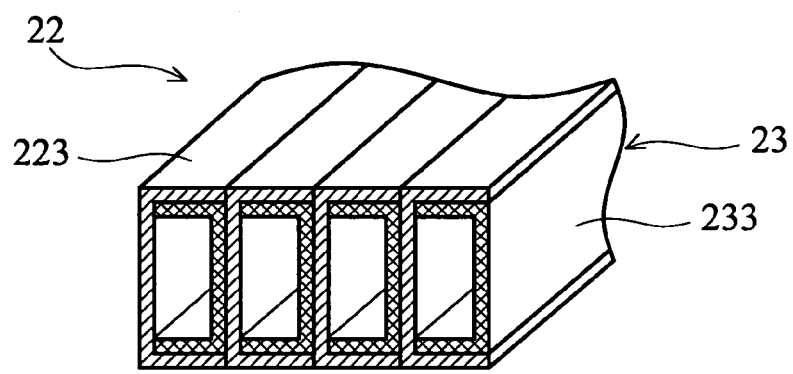
FIG. 4C is another partially enlarged view of heat dissipation modules of the invention.
Figure 4D:
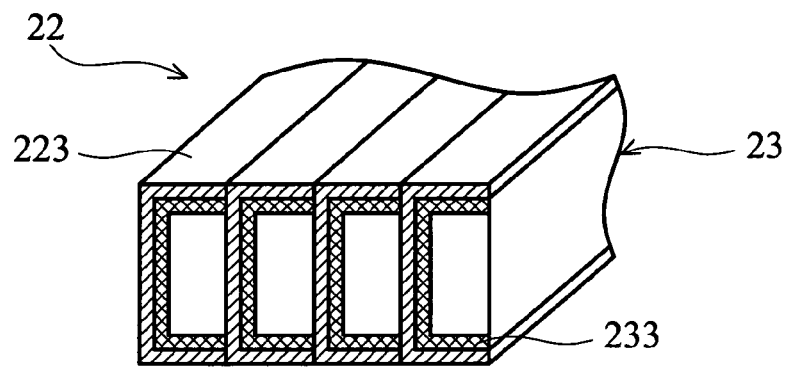
FIG. 4D is another partially enlarged view of heat dissipation modules of the invention.
Figure 4E:
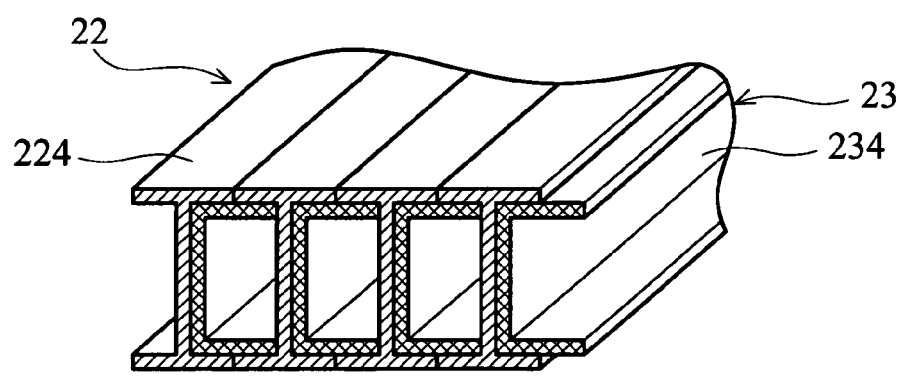
FIG. 4E is another partially enlarged view of heat dissipation modules of the invention.

FIGS. 4A to 4E depict the modifications of the first and second heat dissipation modules. In FIG. 4A, the first heat dissipation module 22 comprises a plurality of connected I-shaped (cross-section) first heat dissipation units 221, and second heat dissipation module 23 comprises a plurality of connected I-shaped (cross-section) second heat dissipation units 231. The second heat dissipation units 231 are partially disposed in the first heat dissipation units 221. In FIG. 4B, the first heat dissipation module 22 comprises a plurality of connected first heat dissipation units 222, with a serrated shape in cross-section, and second heat dissipation module 23 comprises a plurality of connected second heat dissipation units 232, with a serrate shaped in cross-section. The second heat dissipation units 232 are partially disposed in the first heat dissipation units 222. In FIG. 4C, the first heat dissipation module 22 comprises a plurality of connected U-shaped (cross-section) first heat dissipation units 223, and second heat dissipation module 23 comprises a plurality of connected U-shaped (cross-section) second heat dissipation units 233. The openings of the first heat dissipation units 223 and the second heat dissipation units 233 face opposite directions. In FIG. 4D, the first heat dissipation module 22 comprises a plurality of connected U-shaped (cross-section) first heat dissipation units 223, and second heat dissipation module 23 comprises a plurality of connected U-shaped (cross-section) second heat dissipation units 233. The openings of the first heat dissipation unit 223 and the second heat dissipation units 233 face the same direction. In FIG. 4E, the first heat dissipation module 22 comprises a plurality of connected I-shaped (cross-section) first heat dissipation units 224, and second heat dissipation module 23 comprises a plurality of connected U-shaped (cross-section) second heat dissipation units 234. The second heat dissipation units 234 are partially disposed in the first heat dissipation units 224.

As mentioned, the shape, size, number and profile of the first heat dissipation units and the second heat dissipation units may very according to demand. The heat conductive material mentioned may be disposed between every first and second heat dissipation unit.

Figure 5:
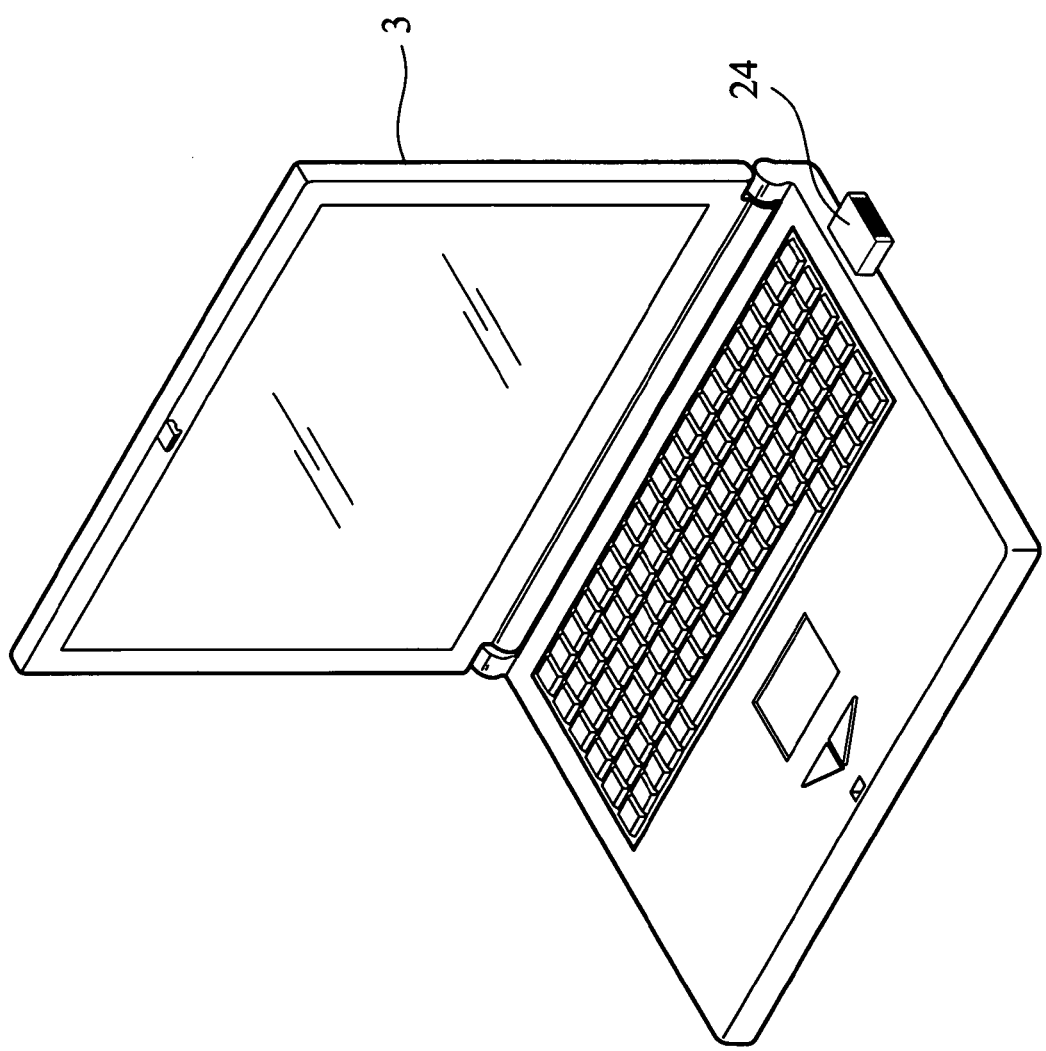
FIG. 5 is a schematic diagram of a heat dissipation device of the invention, disposed in a note book.

FIG. 5 depicts the heat dissipation device disposed in a note book 3. When assembled, the first heat dissipation module 22 is fixed inside the note book 3. The second heat dissipation module 23 is extended or retracted with respect to the first heat dissipation module 22 by the driving mechanism 28. The housing 24 is connected to the second heat dissipation module 23, thereby when the second heat dissipation module 23 moves, the housing 24 moves therewith.

When the first and second heat dissipation modules are in the retracted position, the entire heat dissipation device is received in the note book 3. When the first and second heat dissipation modules are in the extended position, the second heat dissipation module 23 may protrude from the note book 3, reducing the space used by the heat dissipation modules in the note book 3. The housing 24 may prevent the protruded second heat dissipation module 23 from damage, and may prevent users from injury by the second heat dissipation module 23. Note that the heat dissipation device employed in a note book is presented herein for purpose of illustration and description only; it is not intended to be exhaustive or to be limited thereto. On the other hand, the heat dissipation device of the invention may be employed in any kind of electronic device.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation device for dissipating heat from a heat source, comprising:
   a control unit;
   a sensor electrical connecting with the control unit, detecting a temperature of the heat source and reporting the temperature to the control unit;
   a first heat dissipation module;
   a second heat dissipation module retractably connected to the first heat dissipation module; and
   a driving mechanism electrically connected to the control unit and the second heat dissipation module, wherein when the temperature exceeds a first temperature, the control unit informs the driving mechanism to extend away from the second heat dissipation module with respect to the first heat dissipation module.

2. The heat dissipation device as claimed in claim 1, further comprising a fan electrically connected to the control unit, wherein when the temperature exceeds a second temperature, the control unit informs the fan to increase a rotational speed.

3. The heat dissipation device as claimed in claim 2, wherein the first temperature exceeds the second temperature.

4. The heat dissipation device as claimed in claim 1, further comprising a housing connected to the second heat dissipation module.

5. The heat dissipation device as claimed in claim 1, wherein the control unit comprises a central processing unit (CPU).

6. The heat dissipation device as claimed in claim 1, wherein the control unit comprises a basic input output system (BIOS).

7. The heat dissipation device as claimed in claim 1, wherein the driving mechanism comprises a motor.

8. The heat dissipation device as claimed in claim 1, further comprising a heat conductive material disposed between the first heat dissipation module and the second heat dissipation module.

9. The heat dissipation device as claimed in claim 8, wherein the first heat dissipation module comprises a plurality of connected first heat dissipation units, the second heat dissipation module comprises a plurality of connected second heat dissipation units, and the heat conductive material is disposed between every first and second heat dissipation unit.

* * * * *